United States Patent
Su et al.

(10) Patent No.: US 7,359,995 B2
(45) Date of Patent: Apr. 15, 2008

(54) PERIPHERAL DEVICE CONNECTION CURRENT COMPENSATION CIRCUIT

(75) Inventors: Ting-Wen Su, Hsin Chu (TW);
Yu-Chuan Lin, Hsin Chu (TW)

(73) Assignee: RDC Semiconductor Co., Ltd. (TW)

( * ) Notice: Subject to any disclaimer, the term of this patent is extended or adjusted under 35 U.S.C. 154(b) by 192 days.

(21) Appl. No.: 11/346,790

(22) Filed: Feb. 2, 2006

(65) Prior Publication Data

US 2007/0085568 A1    Apr. 19, 2007

(30) Foreign Application Priority Data

Oct. 18, 2005    (TW) .............................. 94136267 A

(51) Int. Cl.
*G06F 3/00* (2006.01)
*H03K 19/094* (2006.01)
(52) U.S. Cl. .......................................... 710/15; 326/83
(58) Field of Classification Search .................. 710/15, 710/18, 105; 326/82, 83
See application file for complete search history.

(56) References Cited

U.S. PATENT DOCUMENTS 6,751,782 B2 *   6/2004   Levin et al. ................... 716/1
6,842,058 B2 *   1/2005   McNitt et al. .............. 327/170
6,901,520 B2 *   5/2005   Odaohhara et al. ......... 713/300
7,193,442 B2 *   3/2007   Zhu ............................. 326/82
7,268,561 B2 *   9/2007   Zhu ............................ 324/538

OTHER PUBLICATIONS

Design Guide For A USB Low Speed Buffer, Intel, Dec. 1996.*
Single-Stage 5V USB Voltage Regulator, Intersil, May 2007.*

* cited by examiner

*Primary Examiner*—Khanh Dang
(74) *Attorney, Agent, or Firm*—Peter F. Corless; Steven M. Jensen; Edwards Angell Palmer & Dodge LLP

(57) ABSTRACT

A peripheral device connection current compensation circuit is proposed, which is designed for use in conjunction with a peripheral control interface on a computer platform, for the purpose of responding to an event of an external peripheral device being connected to the peripheral control interface by providing a current compensating function that can help to prevent an electrical current induced by a pull-up resistor in the peripheral device from flowing into the internal circuitry of the peripheral device. This feature can help maintain the slew rate of the connecting circuitry for the peripheral device at the rated value.

4 Claims, 5 Drawing Sheets

PERIPHERAL DEVICE CONNECTION CURRENT COMPENSATION CIRCUIT

BACKGROUND OF THE INVENTION

1. Field of the Invention

This invention relates to electronic circuitry technology, and more particularly, to a peripheral device connection current compensation circuit which is designed for use in conjunction with a peripheral interface controller on a computer platform, such as a USB (Universal Serial Bus) interface controller, and which is capable of being activated when an external peripheral device, such as a USB-compliant portable flash memory unit, is connected to the USB interface controller to provide a current compensation function that can help prevent an electrical current induced by a pull-up resistor in the peripheral device from flowing into the internal circuitry of the peripheral device, such that the slew rate of the USB connecting circuitry can be maintained at the rated value.

2. Description of Related Art

The computer industry has developed a portable thumb-size data storage unit, such as USB (Universal Serial Bus) flash memory, USB hard disks, etc., which allow the user to conveniently transfer data from one PC (personal computer) to another. Presently, most portable thumb-size data storage units are compliant with the standard USB or FireWire interface on PCs such as desktop computers, notebook computers, tablet computers, network workstations, and so on. These portable thumb-size data storage units are characterized by a plug-and-play (PnP) capability that allows instant use without the need to apply electrical power and install drivers on the PC. Since these thumb-size data storage units are very small in size and thus highly portable, they are becoming a very popular peripheral device on the PC market.

Presently, the USB standard includes two subtypes: USB1.0 and USB1.1. To allow a PC to distinguish whether an externally connected peripheral device is USB1.0 or USB1.1 compliant, a widely used method is to connect a pull-up resistor inside the peripheral device. As shown in FIG. 1, by the USB specification, a standard USB-compliant peripheral device includes four connecting lines: a power line ($V_{bus}$) 11, a minus data line (D−) 12, a plus data line (D+) 13, and a grounding line (GND) 14. In the case that a portable USB flash memory unit 20 is USB1.0 compliant, a pull-up resistor 22 is interconnected between the power line ($V_{bus}$) 11 and the minus data line (D−) 12 as illustrated in FIG. 1; whereas in the case of USB1.1, a pull-up resistor (not shown) will be interconnected between the power line ($V_{bus}$) 11 and the plus data line (D+) 13. When the USB1.0 compliant flash memory unit 20 is connected to a PC (not shown), the pull-up resistor 22 will cause the minus data line (D−) 12 to be set at logic-HIGH voltage state, thereby allowing the PC's USB peripheral controller (not shown) to recognize that the externally connected flash memory unit 20 is USB1.0 compliant and thereupon perform a corresponding configuration procedure for the flash memory unit 20.

One problem to the connection of the above-mentioned pull-up resistor 22 in USB1.0 peripheral device, however, is that it would undesirably cause an induced electrical current to flow from the power line ($V_{bus}$) 11 to the minus data line (D−) 12 and then into the internal circuitry 21 of the USB flash memory unit 20. This phenomenon would cause the slew rate of the USB connecting circuitry to exceed its rated value, thus undesirably causing instability in data transmission to and from the USB flash memory unit 20.

SUMMARY OF THE INVENTION

It is therefore an objective of this invention to provide a peripheral device connection current compensation circuit which can prevent an electrical current induced by a pull-up resistor in a USB1.0 peripheral device from flowing into the internal circuitry of the USB1.0 compliant peripheral device when connected to a computer platform, such that the slew rate of the USB connecting circuitry can be maintained at the rated value.

The peripheral device connection current compensation circuit according to the invention is designed for use in conjunction with a peripheral interface controller on a computer platform, such as a USB (Universal Serial Bus) interface controller, and which is capable of being activated when an external peripheral device, such as a USB-compliant portable flash memory unit, is connected to the USB interface controller to provide a current compensation function that can help prevent an electrical current induced by a pull-up resistor in the peripheral device from flowing into the internal circuitry of the peripheral device, such that the slew rate of the USB connecting circuitry can be maintained at the rated value to ensure the stability of data transmission to and from the USB flash memory unit.

In architecture, the peripheral device connection current compensation circuit according to the invention comprises: (a) a triggering module, which is capable of being activated when the peripheral device is connected to the peripheral interface controller to generate a set of trigger signals including at least one logic-HIGH signal and a logic-LOW signal; (b) a first N-type transistor, which has a gate, a drain, and a source, and whose gate is connected to receive the logic-HIGH signal from the triggering module to thereupon cause an electrically-conductive state between the source and the drain thereof; (c) a second N-type transistor, which is interconnected to the first N-type transistor in such a manner as to allow the second N-type transistor to serve as a current reference for the triggering module; (d) a third N-type transistor, which has a gate, a drain, and a source, and which is connected in such a manner that its gate is connected to receive the logic-LOW signal from the triggering module, its drain is connected to both the source of the first N-type transistor and the gate and drain of the second N-type transistor, and its source is connected to the grounding line of the peripheral interface controller; (e) an N-type transistor clustering module, which is composed of a plurality of N-type transistors connected in parallel and in a predetermined manner that allow the N-type transistor clustering module to serve as a mirror device for the second N-type transistor, where all respective gates of the N-type transistors are connected together to the gate of the second N-type transistor, all respective drains of the N-type transistors are connected together to the minus data line of the peripheral interface controller, while all respective sources of the N-type transistors are connected together to the grounding line of the peripheral interface controller; (f) a P-type transistor, which has a gate, a drain, and a source, and whose gate is connected to the minus data line of the peripheral interface controller, whose source is connected via a resistor to the power line of the peripheral interface controller, and whose drain is connected to drain of the first N-type transistor; and (g) a driving module, which has an input end and an output end, and whose input end is connected to receive a control signal from the peripheral interface controller, and whose output end is connected to the minus data line of the peripheral interface controller to drive the operation of the peripheral device.

The peripheral device connection current compensation circuit according to the invention is characterized by the capability that when an external peripheral device is connected to the USB peripheral interface controller, it will respond by providing a current compensating function that can help to prevent an electrical current induced by a pull-up resistor in the externally-connected peripheral device from flowing into the internal circuitry of the peripheral device. This feature can help maintain the slew rate of the USB connecting circuitry for the peripheral device at the rated value.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The peripheral device connection current compensation circuit according to the invention is disclosed in full details by way of preferred embodiments in the following with reference to the accompanying drawings.

Figure 1:
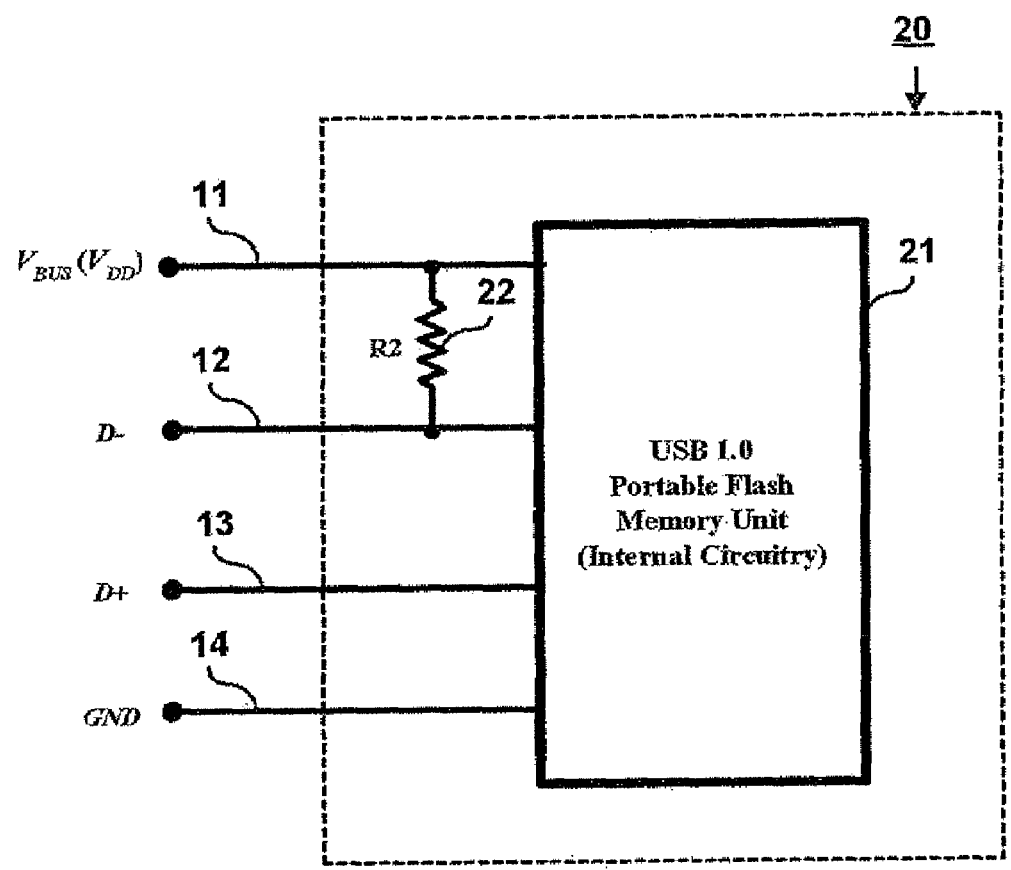
FIG. 1 is a schematic diagram showing the connection of a pull-up resistor inside a USB1.0 compliant flash memory unit.
Figure 2:
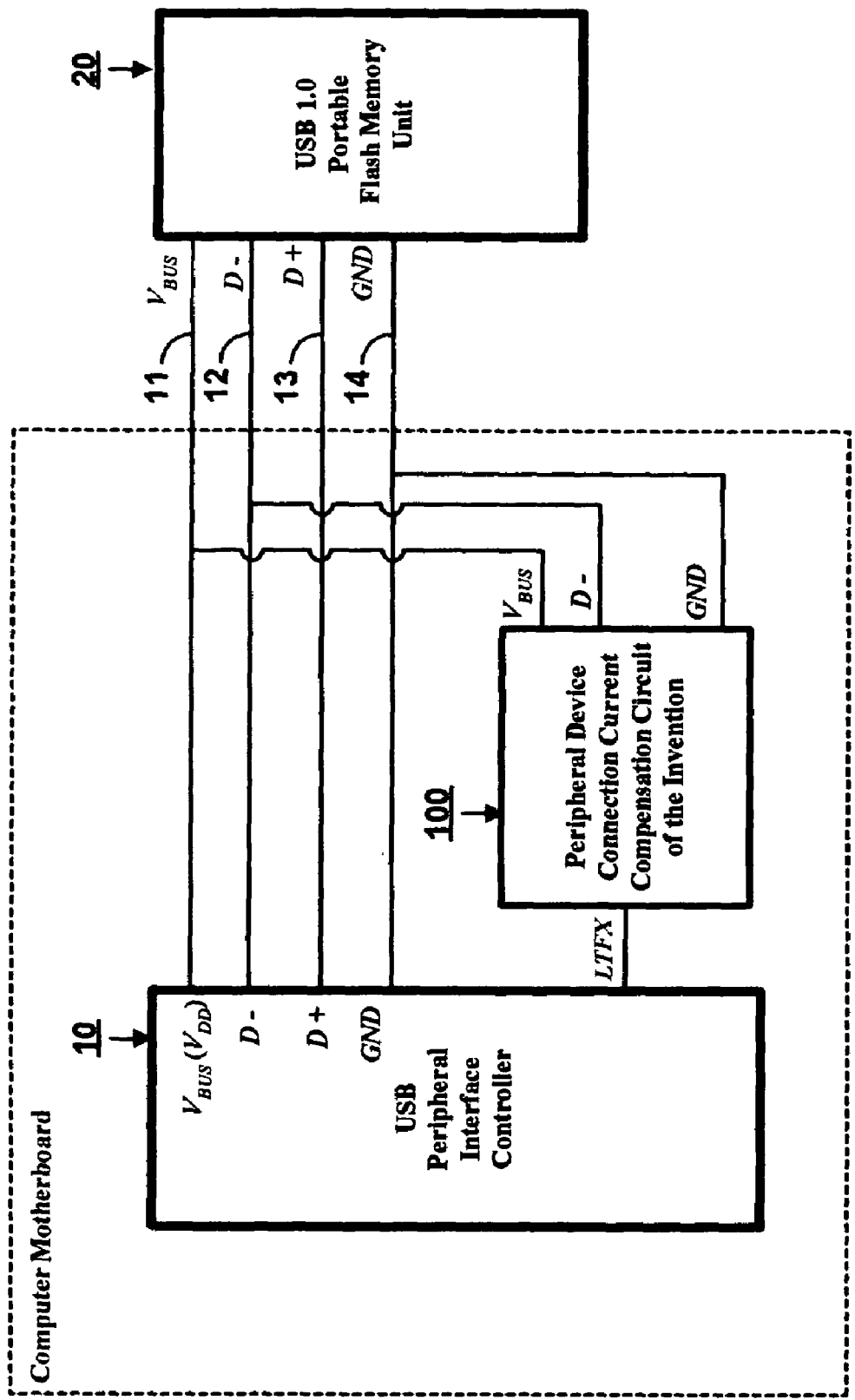
FIG. 2 is a schematic diagram showing the connection of a USB1.0 compliant flash memory unit to a USB interface controller.

FIG. 2 is a schematic diagram showing the application of the peripheral device connection current compensation circuit according to the invention (as the block indicated by the reference numeral 100). As shown, the peripheral device connection current compensation circuit of the invention 100 is designed for use in conjunction with a peripheral interface controller 10, such as a USB (Universal Serial Bus) compliant interface controller, which is externally connectable to a peripheral device, such as a USB1.0 compliant portable flash memory unit 20 shown in FIG. 1. When the flash memory unit 20 is externally connected to the peripheral interface controller 10, the peripheral device connection current compensation circuit of the invention 100 will be activated to provide a current compensation function that can help prevent an electrical current $I_c$ (shown in FIG. 3) induced by the pull-up resistor 22 inside the flash memory unit 20 from flowing into the internal circuitry 21 of the flash memory unit 20, such that the slew rate of the connecting circuitry can be maintained at the rated value.

In practical implementation, for example, the peripheral device connection current compensation circuit of the invention 100 can be realized as an IC chip for external connection to the peripheral interface controller 10. When the peripheral interface controller 10 is connected to the USB1.0 compliant flash memory unit 20, the peripheral device connection current compensation circuit of the invention 100 can be activated to perform its current compensation function.

Figure 3:
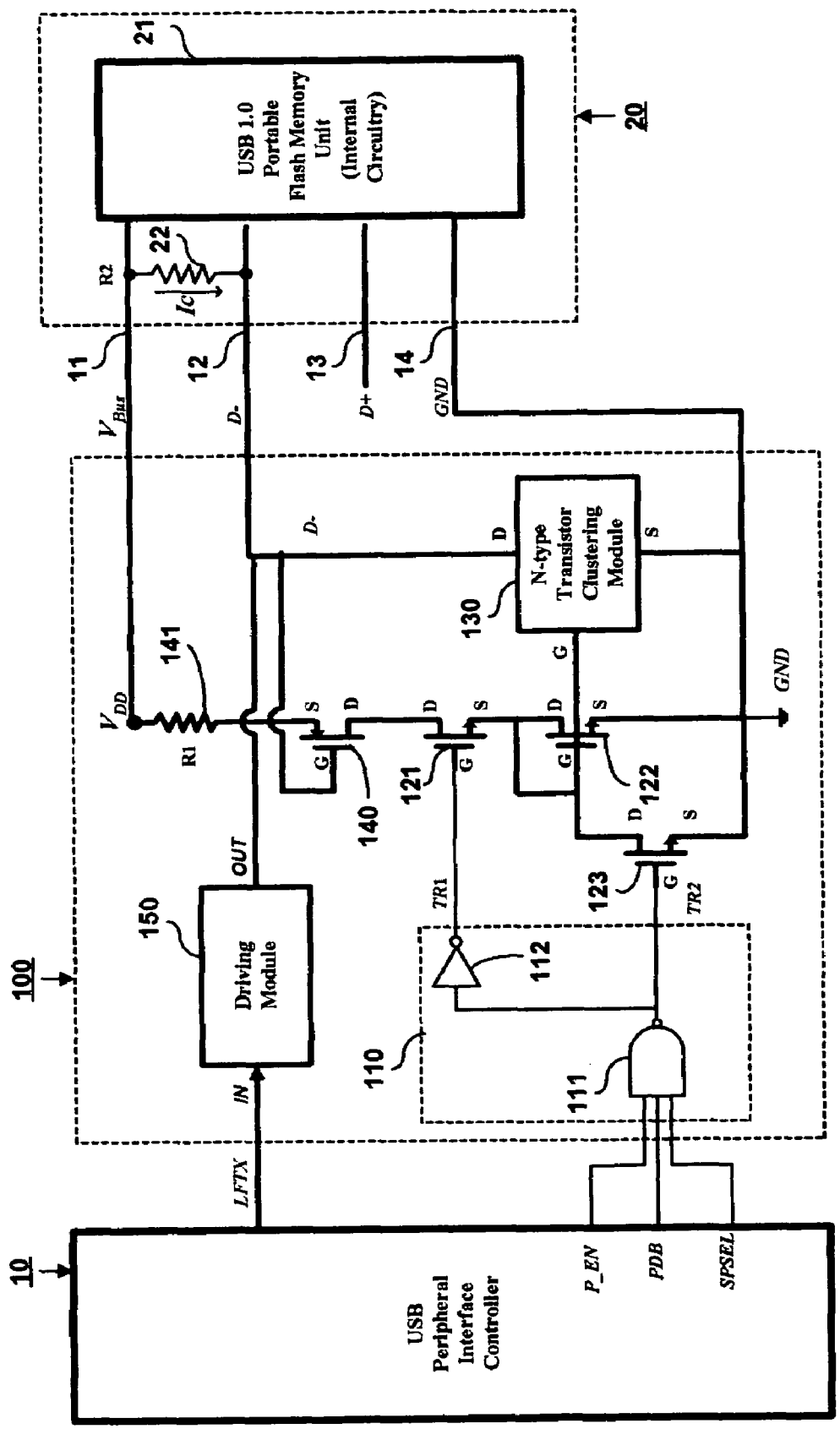
FIG. 3 is a schematic diagram showing the circuit architecture of the peripheral device connection current compensation circuit according to the invention.

As shown in FIG. 3, the circuit architecture of the peripheral device connection current compensation circuit of the invention 100 comprises: (a) a triggering module 110; (b) a first N-type transistor 121; (c) a second N-type transistor 122; (d) a third N-type transistor 123; (e) an N-type transistor clustering module 130; (f) a P-type transistor 140; and (g) a driving module 150.

Firstly, the respective attributes and behaviors of the constituent modules 110, 121, 122, 123, 130, 140, 150 of the peripheral device connection current compensation circuit of the invention 100 are described in details in the following The triggering module 110 has 3 input ends respectively connected to receive 3 logic signals: PDB, SPSEL, and P_EN from the peripheral interface controller 10, where PDB stands for "Power Down Bar" and PDB=1 indicates that the output voltage $V_{DD}$ from the peripheral interface controller 10 is being transmitted via the power line ($V_{bus}$) 11 to the USB1.0 flash memory unit 201; SPSEL stands for "Speed Select" and SPSEL=1 indicates that the peripheral interface controller 10 has set to operate in the USB1.0 mode; and P_EN stands for "PMOS Enable" and P_EN=1 indicates the activation of the peripheral device connection current compensation circuit of the invention 100. In practical implementation, for example, the triggering module 110 is composed of a NAND gate 111 and an inverter 112. During operation, when the USB1.0 flash memory unit 20 is connected to the peripheral interface controller 10, it will cause the peripheral interface controller 10 to respond by outputting PDB=1, SPSEL=1, and P_EN=1 to the triggering module 110, thereby activating the triggering module 110 to respond by outputting a logic-HIGH signal TR1 and a logic-LOW signal TR2, whereof the logic-HIGH signal TR1 is transferred to the gate of the first N-type transistor 121, while the logic-LOW signal TR2 is transferred to the gate of the third N-type transistor 123.

The first N-type transistor 121 is an NMOS (N-type Metal Oxide Semiconductor) transistor, which has a gate G, a drain D, and a source S, and whose gate G is connected to receive the logic-HIGH signal TR1 from the triggering module 110 to thereupon cause an electrically-conductive state between the source S and the drain D thereof, whose drain D is connected to the drain D of the P-type transistor 140, and whose source S is connected to both the drain D and gate G of the second N-type transistor 122 and the drain D of the third N-type transistor 123.

The second N-type transistor 122 is also an NMOS transistor, which has a gate G, a drain D, and a source S, and which is interconnected to the first N-type transistor 121 in such a manner as to allow the second N-type transistor 122 to serve as a current reference for the triggering module 110. More specifically, the second N-type transistor 122 is connected in such a manner that its gate G is connected to the source S of the first N-type transistor 121, the drain D of the third N-type transistor 123, the drain D of itself, and the gate G of the N-type transistor clustering module 130; its drain D is connected to the source S of the first N-type transistor 121 and the gate G of itself, and its source S is connected to the grounding line (GND) 14.

The third N-type transistor 123 is also an NMOS transistor, has which has a gate G, a drain D, and a source S; and which is connected in such a manner that its gate G is connected to receive the logic-LOW signal TR2 from the triggering module 110, its drain D is connected to both the source S of the first N-type transistor 121 and the gate G and drain D of the second N-type transistor 122, and its source S is connected to the grounding line (GND) 14.

Figure 4:
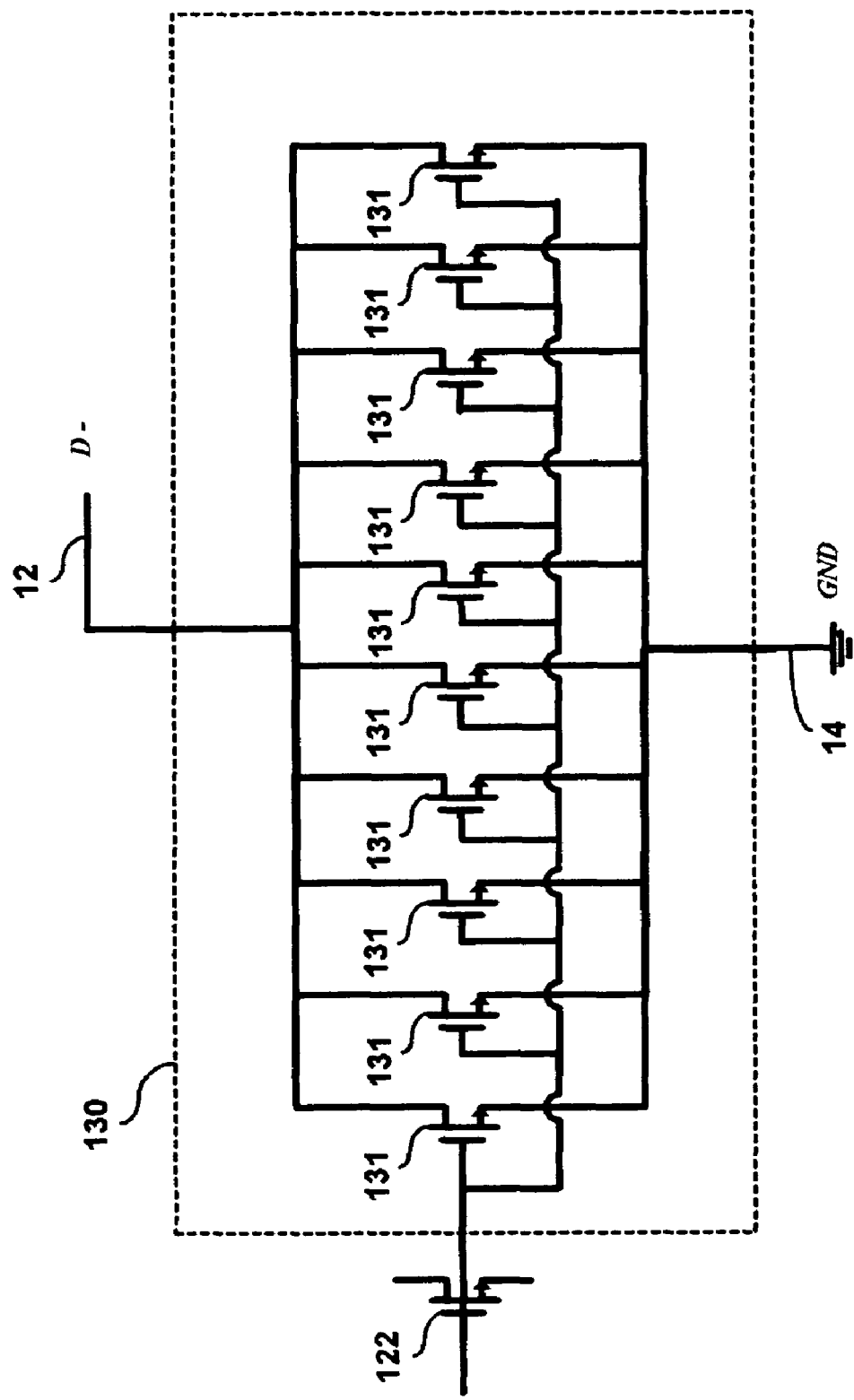
FIG. 4 is a schematic diagram showing the internal circuit structure of an N-type transistor clustering module utilized by the peripheral device connection current compensation circuit of the invention.

The N-type transistor clustering module 130 is composed of a plurality of N-type transistors 131 as shown in FIG. 4, for example 10 N-type transistors 131, which are connected in parallel and in a predetermined manner that allow the N-type transistor clustering module 130 to serve as a mirror device for the second N-type transistor 122. More specifically, the multiple N-type transistors 131 in the N-type transistor clustering module 130 are connected in such a manner that all the respective gates G of these N-type transistors 131 are connected together to the gate G of the second N-type transistor 122, all the respective drains D thereof are connected together to the minus data line (D−) 12, and all the respective sources S thereof t are connected together to the grounding line (GND) 14. In practical implementation, the quantity of the N-type transistors 131 in the N-type transistor clustering module 130 is determined through actual experimentation by which it can be determined that the parallel connection of 10 N-type transistors 131 would provide the optimal compensation effect for the electrical current $I_c$ inducted by the pull-up resistor 22 in the USB1.0 flash memory unit 20.

The P-type transistor 140 is a PMOS (P-type Metal Oxide Semiconductor) transistor, which has a gate G, a drain D, and a source S, and which is connected in such a manner that its gate G is connected to the minus data line (D−) 12, its source S is connected via a resistor (R1) 141 to the power line ($V_{bus}$) 11, and its drain D is connected to drain D of the first N-type transistor 121.

Figure 5:
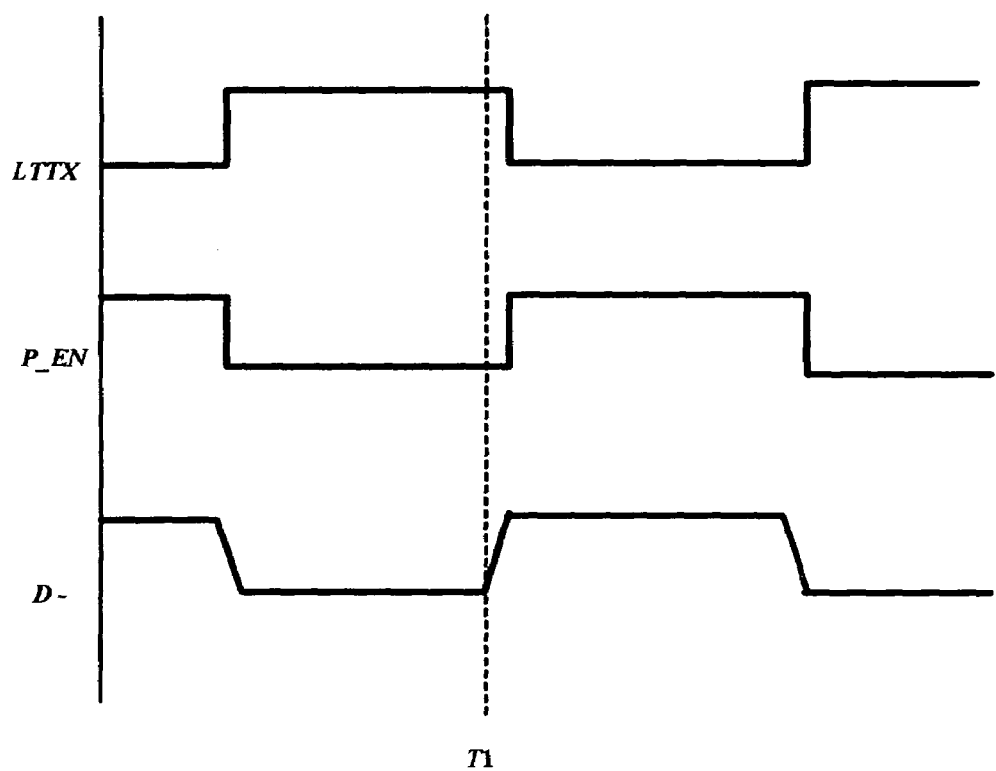
FIG. 5 is a signal diagram showing the waveform and sequencing of a set of logic signals in relation to the operation of the peripheral device connection current compensation circuit of the invention.

The driving module 150 has an input end IN and an output end OUT, and whose input end IN is connected to receive a control signal LFTX from the peripheral interface controller 10, and whose output end OUT is connected to the minus data line (D−) 12 to drive the operation of the peripheral device 20. FIG. 5 shows the waveform and sequencing of the control signal LFTX, which shows that the control LFTX will be set to logic-HIGH state when P_EN=0, and set to logic-HIGH state when P_EN=1.

The following is an example of a practical application of the peripheral device connection current compensation circuit of the invention 100 during actual operation. In this application example, it is assumed that a user inserted the USB1.0 flash memory unit 20 to the peripheral interface controller 10.

Referring to FIG. 1 through FIG. 5 together, as the USB1.0 flash memory unit 20 is connected to the peripheral interface controller 10, the peripheral interface controller 10 will supply an electrical voltage $V_{DD}$ via the power line ($V_{bus}$) 11 to the USB1.0 flash memory unit 20. At this time, as shown in FIG. 5, the minus data line (D−) 12 of the peripheral interface controller 10 is set to logic-LOW state. Since the flash memory unit 20 is USB1.0 compliant, it will cause the peripheral interface controller 10 to output PDB=1, SPSEL=1, and P_EN=1, thereby activating the triggering module 110 to output TR1=1 and TR2=0. Furthermore, as illustrated in FIG. 5, the condition of TR1=1 will cause the first N-type transistor 121 to be set to conductive state (ON). At this time, the second N-type transistor 122 servers as a current reference, while the N-type transistor clustering module 130 serves as a mirror device. Since the gate G of the P-type transistor 140 is connected to the minus data line (D−) 12, the gate-to-source voltage $V_{gs}$ of the P-type transistor 140 will increase with the decrease of the voltage on the minus data line (D−) 12. The increase in $V_{gs}$ will increase the amount of electrical current flowing through the P-type transistor 140, the first N-type transistor 121, the second N-type transistor 122, and the N-type transistor clustering module 130. As a result, the N-type transistor clustering module 130 will consume more electrical current and thereby prevent the electrical current $I_c$ induced by the pull-up resistor 22 in the USB1.0 flash memory unit 20 from flowing into the internal circuitry 21 of the USB flash memory unit 20 (i.e., the load of the peripheral interface controller 10). This allows the slew rate of the USB connecting circuitry to be maintained at the rated value.

Further, as illustrated in FIG. 5, when the minus data line (D−) 12 is at a transition from logic-LOW state to logic-HIGH state at the temporal point T1, the gate-to-source voltage $V_{gs}$ on the P-type transistor 140 will be correspondingly decreased. This causes the N-type transistor clustering module 130 to consume less electrical current. This effect allows the peripheral device connection current compensation circuit of the invention 100 to utilize the logic-HIGH state on the USB1.0 flash memory unit 20 to cause the generation of the electrical current $I_c$ by the pull-up resistor 22.

In conclusion, the invention provides a peripheral device connection current compensation circuit for use in conjunction with a peripheral control interface on a computer platform, such as a USB-compliant peripheral interface controller, for the purpose of responding to an event of an external peripheral device being connected to the peripheral control interface by providing a current compensating function that can help to prevent an electrical current induced by a pull-up resistor in the peripheral device from flowing into the internal circuitry of the peripheral device. This feature can help maintain the slew rate of the connecting circuitry for the peripheral device at the rated value. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A peripheral device connection current compensation circuit for use in conjunction with a peripheral interface controller, which is to be activated when an external peripheral device is connected to the peripheral interface controller for providing a current compensation function to the externally connected peripheral device;

the peripheral device connection current compensation circuit comprising:

a triggering module, which is capable of being activated when the peripheral device is connected to the peripheral interface controller to generate a set of trigger signals including at least one logic-HIGH signal and a logic-LOW signal;

a first N-type transistor, which has a gate, a drain, and a source, and whose gate is connected to receive the logic-HIGH signal from the triggering module to thereupon cause an electrically-conductive state between the source and the drain thereof;

a second N-type transistor, which is interconnected to the first N-type transistor in such a manner as to allow the second N-type transistor to serve as a current reference for the triggering module;

a third N-type transistor, which has a gate, a drain, and a source, and which is connected in such a manner that its gate is connected to receive the logic-LOW signal from the triggering module, its drain is connected to both the source of the first N-type transistor and the gate and drain of the second N-type transistor, and its source is connected to the grounding line of the peripheral interface controller;

an N-type transistor clustering module, which is composed of a plurality of N-type transistors connected in parallel and in a predetermined manner that allow the N-type transistor clustering module to serve as a mirror device for the second N-type transistor, where all respective gates of the N-type transistors are connected together to the gate of the second N-type transistor, all respective drains of the N-type transistors are connected together to the minus data line of the peripheral interface controller, while all respective sources of the N-type transistors are connected together to the grounding line of the peripheral interface controller;

a P-type transistor, which has a gate, a drain, and a source, and whose gate is connected to the minus data line of the peripheral interface controller, whose source is connected via a resistor to the power line of the peripheral interface controller, and whose drain is connected to drain of the first N-type transistor; and a driving module, which has an input end and an output end, and whose input end is connected to receive a control signal from the peripheral interface controller, and whose output end is connected to the minus data line of the peripheral interface controller to drive the operation of the peripheral device.

2. The peripheral device connection current compensation circuit of claim 1, wherein the peripheral interface controller is a USB (Universal Serial Bus) compliant peripheral interface controller.

3. The peripheral device connection current compensation circuit of claim 2, wherein the peripheral device is a USB1.0 compliant, portable flash memory unit.

4. The peripheral device connection current compensation circuit of claim 1, wherein the quantity of the N-type transistors in the N-type transistor clustering module is determined through experimentation to find how many N-type transistors would provide the optimal current compensation effect for the externally connected peripheral device.

* * * * *